US010108509B2

(12) United States Patent
Qidwai et al.

(10) Patent No.: US 10,108,509 B2
(45) Date of Patent: Oct. 23, 2018

(54) DYNAMIC ENABLING OF REDUNDANT MEMORY CELLS DURING OPERATING LIFE

(71) Applicant: Texas Instruments Incorporated, Dallas, TX (US)

(72) Inventors: Saim Ahmad Qidwai, Allen, TX (US); Peter Wongeun Chung, Frisco, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 138 days.

(21) Appl. No.: 15/174,324

(22) Filed: Jun. 6, 2016

(65) Prior Publication Data

US 2017/0017546 A1    Jan. 19, 2017

Related U.S. Application Data

(60) Provisional application No. 62/193,468, filed on Jul. 16, 2015.

(51) Int. Cl.
*G06F 11/00* (2006.01)
*G06F 11/20* (2006.01)
*G11C 29/52* (2006.01)
*G11C 29/04* (2006.01)
*G06F 11/07* (2006.01)
(Continued)

(52) U.S. Cl.
CPC ...... *G06F 11/2094* (2013.01); *G06F 11/0727* (2013.01); *G06F 11/1048* (2013.01); *G11C 11/2277* (2013.01); *G11C 29/04* (2013.01); *G11C 29/52* (2013.01)

(58) Field of Classification Search
CPC ..... G11C 29/04; G11C 29/52; G11C 11/2277; G06F 11/1048; G06F 11/0727; G06F 11/08; G06F 11/10; G06F 11/2017; G06F 11/2094

See application file for complete search history.

(56) References Cited

U.S. PATENT DOCUMENTS

| 6,766,429 B1 | 7/2004 | Bland et al. | |
|---|---|---|---|
| 2009/0199043 A1* | 8/2009 | Schrogmeier | G06F 11/1048 714/6.13 |

(Continued)

OTHER PUBLICATIONS

International Search Report and Written Opinion for PCT/US2016/041237 dated Oct. 13, 2016.

*Primary Examiner* — Joseph D Manoskey
(74) *Attorney, Agent, or Firm* — Kenneth Liu; Charles A. Brill; Frank D. Cimino

(57) ABSTRACT

A memory, such as a non-volatile ferroelectric memory, including both error correction coding (ECC) capability and redundant memory cells. During the system operating life of the memory, upon ECC decoding determining that a symbol read from the memory array at an address cannot be corrected, the failed memory cells are identified, and redundancy enabled to replace those failed cells if available. Redundant columns may be partitioned by row address, to allow the same column of redundant cells to replace bits in different columns for different portions of the memory. Dynamic redundancy is provided by the disclosed embodiments, extending the reliability of the memory during its system operating life.

20 Claims, 3 Drawing Sheets

(51) Int. Cl.
*G11C 11/22* (2006.01)
*G06F 11/10* (2006.01)

(56) References Cited

U.S. PATENT DOCUMENTS

| | | | | |
|---|---|---|---|---|
| 2011/0231736 | A1* | 9/2011 | Toops | G06F 11/1016 |
| | | | | 714/768 |
| 2013/0173970 | A1* | 7/2013 | Kleveland | G11C 29/44 |
| | | | | 714/710 |
| 2013/0212449 | A1 | 8/2013 | O'Connell | |
| 2013/0332674 | A1* | 12/2013 | Tanzawa | G06F 3/0689 |
| | | | | 711/114 |
| 2014/0281254 | A1* | 9/2014 | Wilkerson | G06F 12/0891 |
| | | | | 711/133 |
| 2015/0033064 | A1* | 1/2015 | Davis | G11C 29/4401 |
| | | | | 714/6.11 |
| 2015/0162063 | A1 | 6/2015 | Mueller | |

* cited by examiner

DYNAMIC ENABLING OF REDUNDANT MEMORY CELLS DURING OPERATING LIFE

CROSS-REFERENCE TO RELATED APPLICATIONS

This application claims priority, under 35 U.S.C. § 119(e), of Provisional Application No. 62/193,468, filed Jul. 16, 2015, incorporated herein by this reference.

STATEMENT REGARDING FEDERALLY SPONSORED RESEARCH OR DEVELOPMENT

Not applicable.

BACKGROUND OF THE INVENTION

This invention is in the field of solid-state semiconductor memories. Embodiments are more specifically directed to the reliability of such memories.

The ubiquity of solid-state semiconductor memory in electronic systems of many types, from large-scale computing systems and mass data storage (i.e., disk replacement) applications to small-scale controllers and sensors, is well known in the industry. Indeed, the low cost-per-bit now achievable for solid-state memory has enabled modern electronic systems to implement and execute complex computational and control functions in a wide range of applications.

Various types of semiconductor memory are known in the art. Dynamic random access memory (DRAM) and static RAM (SRAM) memories provide high density storage and rapid access, but are volatile in that their contents are lost at power-down; as such, DRAM and SRAM are typically used as data memory. Non-volatile memory technologies include electrically erasable programmable read-only memory (EEPROM) (implemented as either "flash" or non-flash erase memory), mask-programmable read-only memory (ROM), one-time-programmable (OTP) ROM, and ferroelectric memory (FRAM). Non-volatile memory is often used as program memory and mass data storage (e.g., solid-state disk) in modern electronic systems.

The increased memory density for each of these technologies has enabled the implementation of substantial memory capacity within larger scale integrated circuits, such as those including modern complex microprocessors, microcontrollers, digital signal processors, and other large-scale logic circuitry. For example, the so-called "system on a chip" (SoC) typically includes embedded memory of various technologies as program and data memory. Indeed, these memory resources can occupy a relatively large fraction of the chip area of a microcontroller or SoC device. This leverage makes yield loss due to defects in the embedded memories especially costly. Of course, the desire to increase memory density by shrinking the semiconductor device features increases yield pressure, particularly for memory arrays.

Accordingly, many semiconductor memories, whether embedded in a large-scale integrated circuit such as an SoC or in the form of stand-alone memory devices, now include redundant memory cells that can be enabled at manufacturing test to logically replace failed memory cells in the main array. As known in the art, these redundant cells are often arranged as one or more additional columns adjacent to the main memory array, along with the necessary read/write circuitry for those columns. Another approach provides one or more redundant rows of memory cells; in this case, additional sense amplifiers and other read/write circuitry may not be required. In either case, the memory is configured to enable the redundant cells in the event one or more failed cells are identified at manufacturing test. The redundant cells are typically enabled by blowing fuses or programming non-volatile configuration registers in the memory.

As is also well known in the art, semiconductor memories can also be vulnerable to cell failures over the operating life of the integrated circuit. In some cases, for example in DRAM memories, the failures may be "soft" failures in that a cell may sporadically return errored data when read, but then function properly for the remainder of its life. "Hard" failures in which a cell permanently loses the ability to retain data are typically due to physical mechanisms occurring over time, often at the site of a physical defect or contaminant at the particular cell.

As such, some memories include error correction capability to correct such errors that occur over the operating life of the device. Error detection and correction is typically provided by storing each data word as a coded "symbol", where the number of bits in the symbol is greater than the number of bits in the data word itself, for example with the additional bits stored in additional columns in the array. Depending on the particular error detection and correction technique, decoding of the over-specified symbol can provide the correct data word even if one or more of the data bits of the symbol are erroneous. The level of error detection and correction can range from a simple parity check, to a check sum provided for each data word, up to more complicated non-systematic codes.

For the case of FRAM devices, it has been observed from long-term reliability testing that FRAM cells are somewhat vulnerable to depolarization over time. This depolarization is reflected in data retention failures over the device life. FRAM cells that are constructed as two-transistor two-capacitor (2T-2C) cells are less susceptible to this type of data retention failure than are one-transistor one-capacitor (1T-1C) FRAM cells, because the 2T-2C cell stores data as complementary polarization states on its two capacitors. The complementary polarization states of the 2T-2C cell are reflected as a differential signal when sensed, providing a larger read margin than the 1T-1C cell, which is read by comparing the polarization state of the ferroelectric capacitor against a reference level. While 1T-1C FRAM memory has nearly twice the bit density of 2T-2C FRAM, its reduced read margin is reflected in weaker data retention performance, which limits the use of 1T-1C FRAM in many data-critical applications.

BRIEF SUMMARY OF THE INVENTION

Disclosed embodiments provide a semiconductor memory and method of operating the same that provide improved tolerance to the number of bit failures occurring over the operating life of the device.

Disclosed embodiments provide such a memory and method that can be implemented with relatively little overhead circuitry.

Disclosed embodiments provide such a memory and method that can enable the use of 1T-1C FRAM memory in data retention-sensitive applications.

Other objects and advantages of the disclosed embodiments will be apparent to those of ordinary skill in the art having reference to the following specification together with its drawings.

According to certain embodiments, a semiconductor memory such as a ferroelectric random access memory (FRAM) includes both redundant memory cells and error detection/correction capability. The redundant memory cells need not be enabled at the time of manufacture, but are available for enabling during the operating life of the device. Upon the error detection/correction logic detecting a non-correctable error in a retrieved symbol during system operation of the memory, a failed cell corresponding to an errored bit in the symbol is determined, for example by an additional read/write operation, and one or more redundant memory cells are enabled to logically replace the failed cell.

DETAILED DESCRIPTION OF THE INVENTION

This specification will describe one or more embodiments as implemented into a semiconductor memory, for example a ferroelectric random access memory (FRAM), as it is contemplated that this invention is particularly advantageous in that context. However, it is also contemplated that concepts of this invention may be beneficially applied to other applications, for example memories of any of a number of technologies, whether implemented as a stand-alone memory device or as an embedded memory resource in a larger scale integrated circuit. Accordingly, it is to be understood that the following description is provided by way of example only, and is not intended to limit the true scope of this invention as claimed.

Figure 1:
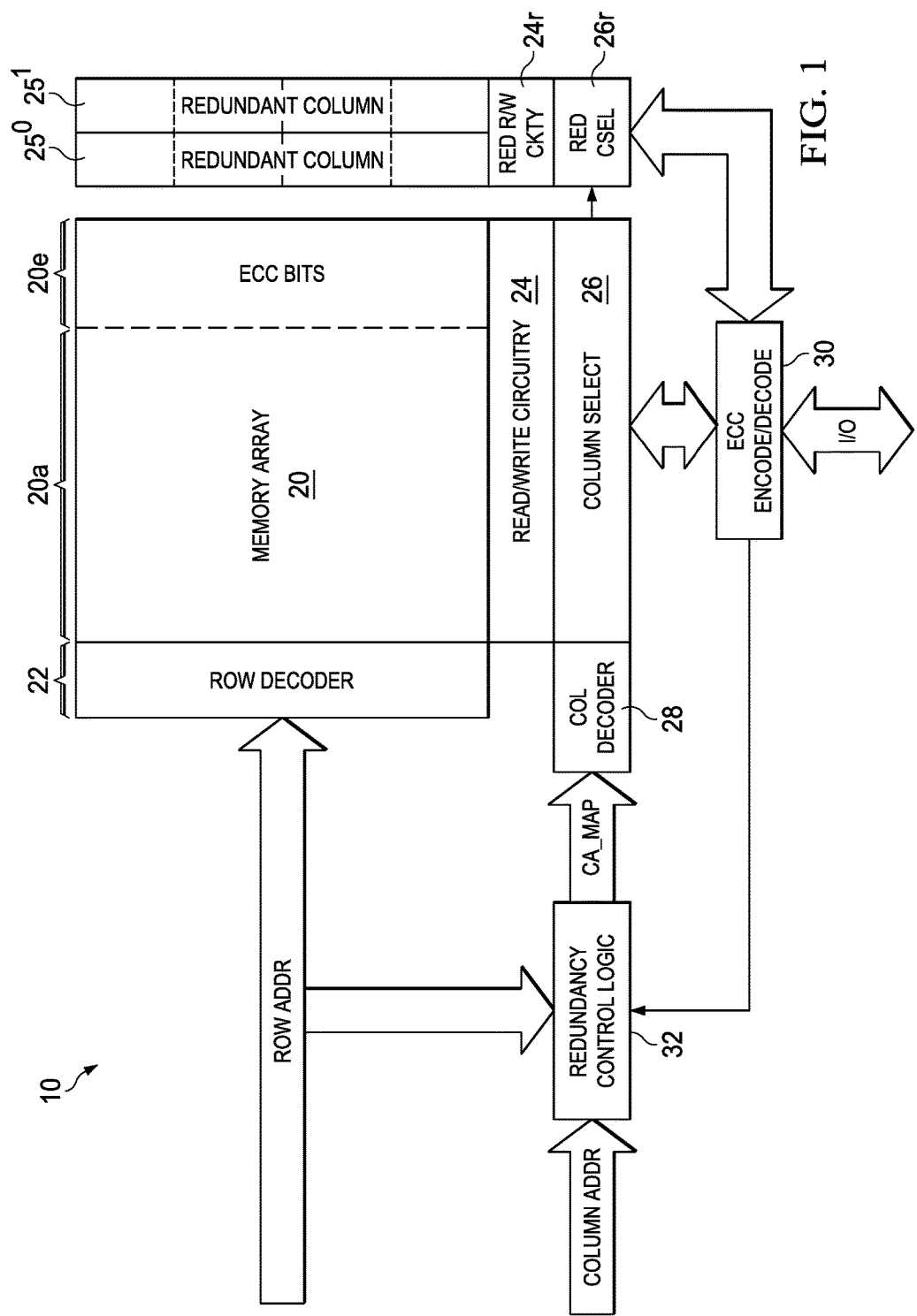
FIG. 1 is an electrical diagram, in block form, of a semiconductor memory constructed according to an embodiment.

FIG. 1 illustrates the architecture of memory 10 constructed according to an embodiment. As mentioned above, the particular arrangements and implementations of memory 10 may vary widely, for example as one or more memory arrays within a larger scale integrated circuit such as a microprocessor or microcontroller, or realized as a stand-alone memory integrated circuit. In addition, memory 10 according to this embodiment may be constructed according to any one of a number of memory technologies, including volatile memory technologies such as dynamic random access memory (DRAM) or static random access memory (SRAM), and non-volatile memory technologies such as electrically erasable programmable read-only memory (EE-PROM) (implemented as either "flash" or non-flash erase memory), mask-programmable read-only memory (ROM), one-time-programmable (OTP) ROM, and ferroelectric memory (FRAM). As noted above, it is contemplated that this embodiment will be especially beneficial when applied to FRAM, particularly by facilitating the use of 1T-1C FRAM cells in reliability-sensitive applications.

In the architecture of FIG. 1, memory 10 includes memory cells arranged in rows and columns within memory cell array 20. While a single instance of memory cell array 20 is shown in FIG. 1, it is to be understood that memory 10 may include multiple memory cell arrays 20, each corresponding to a memory block within the address space of memory 10.

In the example of FIG. 1, array 20 includes rows and columns of memory cells, with the cells in the same column sharing one or a pair of bit lines, depending on the bit cell construction, and with the cells in the same row sharing one of word lines used to couple the cells in a selected row to those bit lines. Row decoder 22 receives a row address value indicating a row of cells in array 20 to be accessed, and energizes a word line corresponding to that row address value. Read/write circuits 24 are constructed in the conventional manner, for example to include a number of sense amplifiers and write circuits that are each coupled to a bit line for a column. Column decoder 28 controls column select circuit 26 to select a subset of read/write circuits 24, according to a column address value (described in further detail below), thus selecting the particular cells within the selected row that contain a symbol stored at a memory address comprised of its row address and column address portions.

Alternatively, memory 10 may be constructed according to an "interleaved" architecture, in which fewer read/write circuits 24 than columns are provided. In this case, column select circuit 26 selects which bit lines are to be coupled to read/write circuits 24, according to the column address. It is contemplated that various row and column architectures, whether non-interleaved (as described above) or interleaved, or having some other arrangement, may be used in connection with these embodiments.

According to this embodiment, array 20 includes a sufficient number of memory cells that each memory address retrieves a number of bits greater than the number of bits in the desired data word, with the additional bits used to perform error detection or error correction. For purposes of this description, the term "error correction coding", or "ECC", will be used to refer to either or both of error detection and error correction techniques; error correction techniques necessarily include error detection.

As is well known in the art, error correction coding (ECC) encodes a given data word of m bits into a symbol of n bits (n>m) representing that data word. The additional n-m bits provide the ability to detect whether an error is present in any bit of the symbol, and for many codes, provide the ability to correct one or more errored bits in the symbol. Various ECC codes are known in the art, including parity bits, checksums, cyclic redundancy checks, convolutional codes, block codes such as Hamming codes, Reed-Solomon codes, and the like. For semiconductor memories, ECC codes are typically systematic codes, in that the data word (i.e., payload) is embedded in the symbol in combination with separate check bits (ECC bits). Non-systematic codes, in which the data word is not embedded within the symbol but can only be discovered after decoding the entire symbol, may alternatively be used. Some ECC codes are only error-detecting, in that they are only able to detect errors but are unable to correct the errors. Other ECC codes are error-correcting, permitting the correction of one or more errored bits in a retrieved symbol. The number of errored bits that are correctable by an ECC code is determined by the particular error-correcting code along with the number n-m of code bits in each symbol beyond the m bits of the encoded data word.

The architecture shown in FIG. 1 corresponds to a systematic code, in which main array portion 20a stores the data words, and ECC portion 20e corresponds to a number of columns of memory cells that store the ECC bits for those data words. As such, retrieval of a row of cells in memory array 20 retrieves one or more data words in that row of main array portion 20a, along with the corresponding ECC bits from portion 20e in that same row for those data words. These ECC bits from portion 20e are sensed by read/write circuitry 24 and, if selected by column select 26, are forwarded along the corresponding data word as a symbol to ECC encoder/decoder 30.

ECC encoder/decoder 30 may be constructed as conventional logic (e.g., programmable logic, semi-custom or custom logic circuitry) capable of encoding data words into symbols and of decoding symbols into data words, according to the applicable ECC code. ECC encoder/decoder 30 may be integrally implemented within the architecture of memory 10, as suggested by FIG. 1, or alternatively may be realized and carried out by logic circuitry elsewhere in the integrated circuit, including by a processor or logic circuitry in a larger scale integrated circuit. It is contemplated that those skilled in the art having reference to this specification will be readily able to realize ECC encoder/decoder 30 as appropriate for particular implementations, without undue experimentation.

In the read context, ECC encoder/decoder 30 decodes the symbol to determine whether any errored bits are present. If not, the data word corresponding to the retrieved symbol is forwarded on input/output lines I/O to the desired destination. If an error-correcting code is implemented, and if the number of errored bits does not exceed the correctable number for the code, ECC encoder/decoder 30 corrects the errored bits in the symbol and forwards the data word on input/output lines I/O. If an error is detected by ECC encoder/decoder 30 applying an error-detecting code, or if the number of errored bits exceeds the correctable number for an error-correcting code, ECC encoder/decoder 30 issues a fault, sets a flag, or issues another appropriate notification.

Conversely, ECC encoder/decoder 30 receives input data in the form of data words from input/output lines I/O and encodes those input data words into symbols that are written to main array portion 20a and ECC portion 20e.

According to this embodiment, memory 10 also includes redundant memory cells that may be selectively enabled to replace memory cells in array 20 in the address space of memory 10. In the architecture of FIG. 1, these redundant memory cells are arranged in two redundant columns $25_0$, $25_1$; of course, only a single redundant column $25_0$ or more than two such columns may alternatively be deployed. Redundant columns $25_0$, $25_1$ are associated with redundant read/write circuits 24r and redundant column select 26r, and as such are coupled to ECC encoder/decoder 30 in similar fashion as read/write circuitry 24 and column select 26. Redundant column select 26r receives signals from column decoder 28 indicating selection of either, both, or none of redundant columns $25_0$, $25_1$ for forwarding to ECC encoder/decoder 30.

Alternatively, redundant memory cells may be provided in memory 10 in the form of one or more redundant rows of memory cells. In this alternative arrangement, row decoder 22 would be extended to drive word lines for the redundant rows, when replacement of a row of memory cells is enabled. Row redundancy in this fashion eliminates the need for additional read/write circuitry and column select circuitry, as in the case of the column redundancy shown in FIG. 1. Both column redundancy and row redundancy techniques are well known in the art.

In conventional memories, whether embedded memories in a large-scale integrated circuit such as an SoC or stand-alone memory devices, typically only either error correction coding or redundancy is implemented. More specifically, redundancy techniques are conventionally enabled at manufacturing test to replace time-zero defective bits, rows, or columns, as the case may be, prior to assembly of the integrated circuit into its end system application.

According to these embodiments, however, redundancy in memory 10 is implemented in combination with ECC circuitry (and corresponding additional memory cells), with ECC and redundancy operating cooperative during the life of memory 10 in its system application. The dynamic redundancy provided by the combination of ECC and redundant cells extends the error correction capability of memory 10. This extended reliability is especially useful in connection with memory technologies, such as FRAM cells and other non-volatile memories, that are vulnerable to data retention degradation over operating life.

As shown in FIG. 1, ECC encoder/decoder 30 is coupled to redundancy control logic 32 in this embodiment. In its general operation, ECC encoder/decoder 30 is capable of indicating to redundancy control logic 32 the results of its error correction decoding, specifically indicating whether one or more errored bits are present in a symbol read from array 20 for a particular memory address. As will be described in further detail below, this signal may indicate the occurrence of an errored bit even if it is correctable, or may be arranged to only indicate the occurrence of an uncorrectable error in that symbol.

Redundancy control logic 32 may be realized as logic circuitry, such as programmable logic, or custom or semi-custom logic, for mapping memory addresses to redundant memory cells, such as performed in conventional memories with redundancy enabled at manufacturing test (i.e., prior to assembly of the integrated circuit into its system application). According to this embodiment, however, redundancy control logic 32 will include some of the decision-making logic for determining whether to enable redundant memory cells, specifically in response to signals from ECC encoder/decoder 30 as noted above; in conventional memories, this decision-making logic is typically embodied in the automated test equipment carrying out the memory test. The operation of this logic will be described in further detail below; it is contemplated that those skilled in the art having reference to this specification will be readily able to realize the appropriate program instructions for, or logic circuitry in, redundancy control logic 32 so as to carry out these functions in the appropriate manner for particular implementations, without undue experimentation.

Also in this embodiment, as in conventional redundancy-capable memories, redundancy control logic 32 will include some non-volatile memory capability for storing address information pertaining to which memory addresses that originally refer to cells in main array 20a are to instead refer to redundant cells in redundant columns $25_0$, $25_1$. Where memory array 20 is an arrangement of FRAM cells, the non-volatile storage in redundancy control logic 32 can also be realized by FRAM. For example, the FRAM cells in memory array 20 may be of the 1T-1C type, while those in redundancy control logic 32 are 2T-2C FRAM cells. Other types of non-volatile storage may of course alternatively be used.

As described above, the redundant cells in this architecture are arranged as columns 25. Redundancy control logic 32 thus receives the column address portion of the memory address and, if a redundant cell is to replace a cell in memory array 20, maps that column address to the physical address of the appropriate redundant column $25_0$, $25_1$, and applies that mapped physical address to column decoder 28 on lines CA_MAP. Column decoder 28 issues the appropriate control signals so that column select 26 and redundant column select 26r select and forward the columns of memory array 20 and redundant columns 25 to which the mapped address refers. Conversely, if the incoming column address is not mapped to a redundant column $25_0$, $25_1$, redundancy control logic 32 forwards the received column address to column decoder 28 on lines CA_MAP, in response to which column decoder 28 issues the appropriate control signals to column select 26 to select the columns of memory array 20 to which the received column address refers.

In the architecture of FIG. 1, redundant columns $25_0$, $25_1$ are each partitioned into four partitions to allow for additional flexibility in the replacement of cells in memory array 20. This partitioning, while optional, allows a single redundant column 25 to replace cells in four different columns of array 20, so long as the failed cells are in different row address segments (quarter-array segments, in this example). Accordingly, a portion of the row address is applied to redundant control logic 32, as shown in FIG. 1, with that row address portion indicating the row address segment to which the current memory address is directed. For this four-partition example, this row address portion may be the two most significant bits of the row address. This portion of the row address is included in the mapping performed by redundant control logic 32 to determine whether one of the redundant columns $25_0$, $25_1$ is to be selected for the memory address being accessed.

Figure 2:
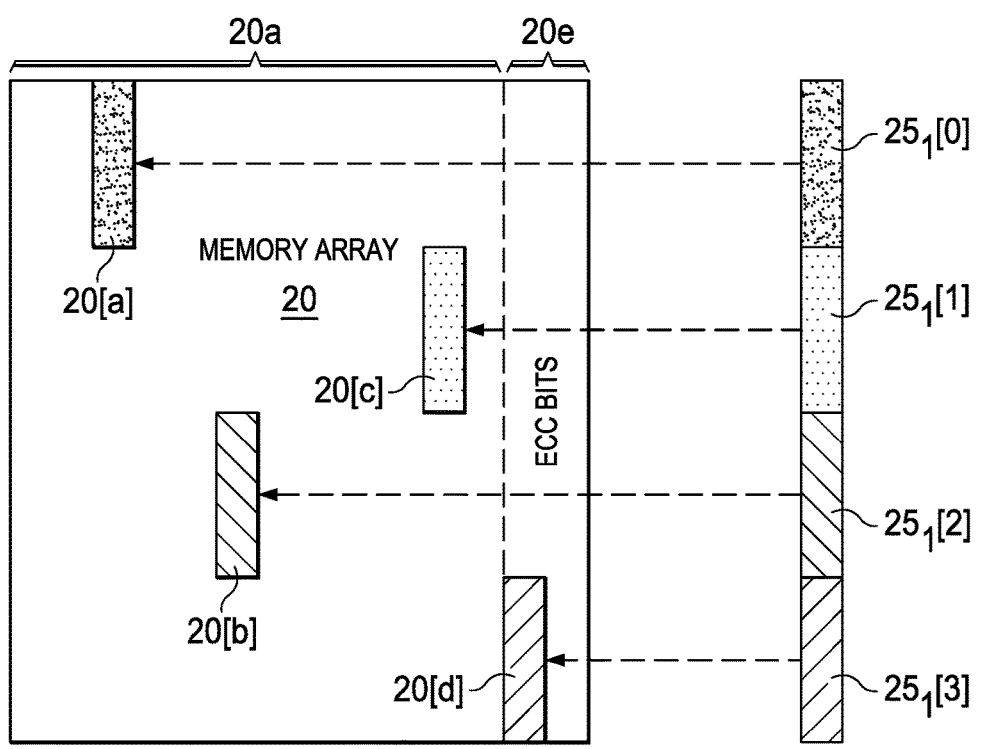
FIG. 2 is a block diagram of the memory array of the memory of FIG. 1, illustrating an example of the replacement of cells in the main array with redundant cells, according to an embodiment.

FIG. 2 illustrates an example of this partitioned redundancy, for the example of redundant column $25_1$ replacing cells in four different columns of memory array 20. In this example, the top partition $25_1[0]$ of redundant column $25_1$ is mapped, in redundant control logic 32, to replace a portion $20[a]$ of a column a in main array portion 20a. Specifically, this portion $20[a]$ resides in the uppermost row address segment of array 20, corresponding to row addresses 00xx . . . xx (assuming correspondence between the logical address and the physical rows of array 20). Partition $25_1[1]$ of redundant column $25_1$ replaces a portion $20[c]$ of a different column c in main array portion 20a, for the row address segment corresponding to row addresses 01xx . . . xx. Partition $25_1[2]$ of redundant column $25_1$ similarly replaces a portion $20[b]$ of a column b in main array portion 20a for the row address segment corresponding to row addresses 10xx . . . xx. According to this embodiment, the column partitions replaced by partitions of redundant columns 25o, $25_1$ may be in either main array 20a or in ECC portion 20e; this is evident in the example of FIG. 2 by redundant partition $25_1[2]$ replacing a portion $20[d]$ of a column d in ECC portion 20e for the row address segment corresponding to row addresses 11xx . . . xx.

As noted above, the redundancy scheme according to these embodiments is directed to later life failures. Because these failures tend to be single bit failures in modern non-volatile memories (e.g., data retention failures), rather than full row or full column failures, the partitioning of redundant columns $25_0$, $25_1$ is contemplated to be especially beneficial, allowing redundant replacement of a larger number of cell failures and thus significantly improved reliability for the device.

This partitioning of redundant columns 25 (and, alternatively, similar partitioning of redundant rows if implemented) is contemplated as an option in the memory architecture according to these embodiments. In addition, if such partitioning is implemented, the number of partitions in each redundant column or row may vary from the four partitions shown in FIG. 2, with either fewer or more partitions implemented. In one example, it is contemplated that the redundant columns for a memory array of 512 rows may be partitioned into sixteen partitions of thirty-two rows each. The partitioning scheme used in any particular implementation can be selected according to the reliability performance of the particular memory technology involved, considered in combination with the overhead circuitry required to implement the desired partitioning. It is contemplated that those skilled in the art having reference to this specification will be able to optimize the arrangement of redundant memory cells for their particular implementations.

Figure 3:
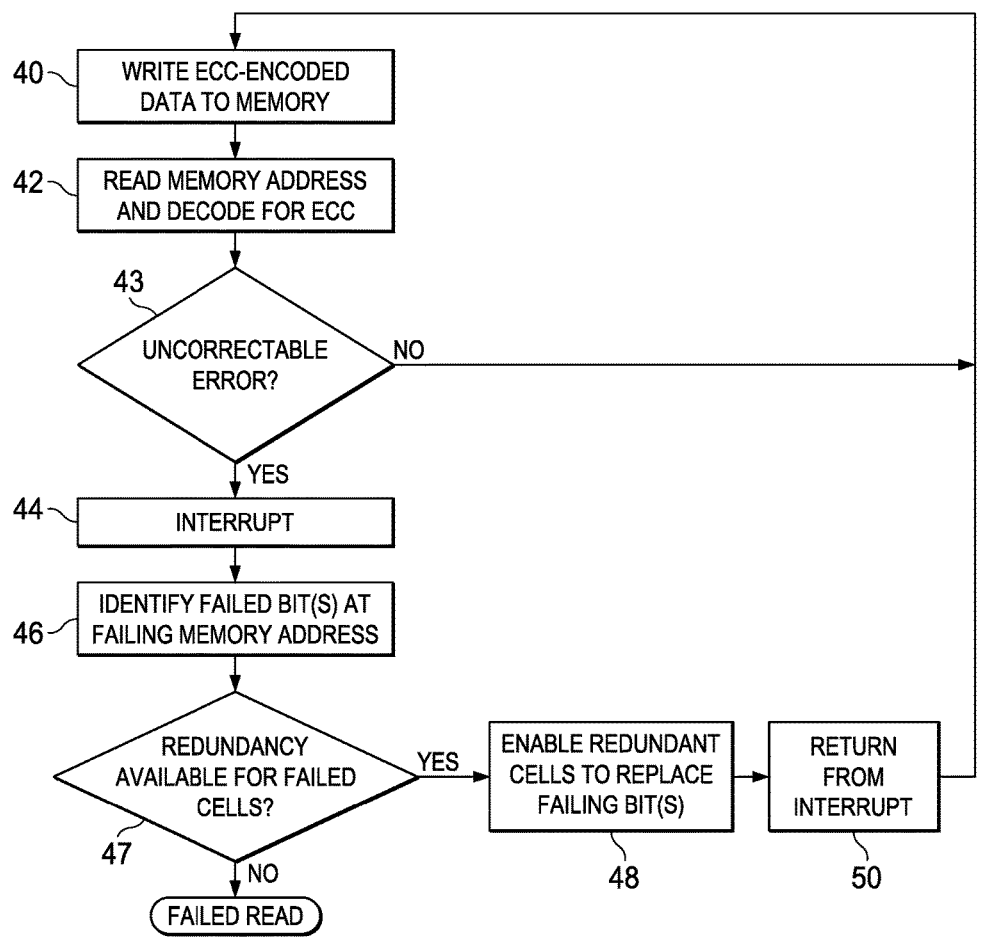
FIG. 3 is a flow diagram illustrating the operation of the memory of FIG. 1 according to an embodiment.

Referring now to FIG. 3, the operation of memory 10 according to an embodiment will now be described in detail. As mentioned above, it is contemplated that redundancy control logic 32 will be constructed or programmed to carry out some or all of the functions described in connection with this embodiment, in combination with other peripheral circuitry in and external to memory 10 that are involved with its access. According to these embodiments, this operation of memory 10 is occurring during its normal system use, rather than as part of a manufacturing or other test sequence. As such, prior to the operations shown in FIG. 3, memory 10 will have been fully tested in its manufacture, and the integrated circuit in which memory 10 is realized will have been installed or otherwise assembled into its system application, and typically will have been in operation for some time prior to the occurrence of these operations.

In process 40, memory 10 is accessed by an external function, such as a microprocessor or processor core, to write data into memory array 20 at certain memory addresses. As part of this process 40, ECC encoder/decoder 30 will encode this input data according to the ECC code being used, and the encoded symbol will be written into array 20 at that address. For the example described above in which a systematic ECC code is used, the data word of the symbol will be written into main array portion 20a and the corresponding ECC bits will be written into ECC portion 20e. Of course, as well known in the art, the writing of input data into array 20 in this process 40 will typically write data for many, if not all, addresses in the address space of memory 10, either as a burst or block or in a distributed manner interleaved with other memory operations. The particular manner in which data are written into memory array 20 is not of particular importance according to this embodiment, so long as encoded data are stored for some of the memory addresses of array 20.

In process 42, a read of memory array 20 at a particular memory address is performed. Since the data are stored in the form of ECC symbols, process 42 involves the decoding of the symbol retrieved from the cells of array 20 corresponding to the memory address, to read the data word portion of the symbol from main array portion 20a and the ECC bits from ECC portion 20e, in this systematic code example. Upon the decoding operation performed by ECC encoder/decoder 30 determining either that no error is present in the retrieved symbol, or that the number of errored bits are no greater than the correctable number for the code being used (decision 43 returns a "no" result), the read of process 42 is successful, and the data word decoded from the retrieved symbol (with any errored bits corrected in the ECC decoding) is forwarded on input/output lines I/O to the desired destination. The operation of memory 10 then continues in the normal manner, with writes (process 40) and reads (process 42) performed as desired under the control of the processor core or other accessing function in the system.

According to this embodiment, however, if the ECC decoding performed in process 42 in a read of a memory address determines that an uncorrectable error is present in the symbol as retrieved from array 20 for that address, more specifically because the decoding detects a number of errored bits greater than the correctable number for that code (decision 43 returns a "yes" result), memory 10 issues an interrupt to the memory access in process 44. In this example, the usual operation for the system involved in handling such an operation will be performed, for example by the system storing its current context, as known in the art. According to this embodiment, an interrupt handler is then executed to enable redundant memory cells to replace the array cells corresponding to those errored bits.

The interrupt handler begins with process 46 in which the errored bits at the failing memory address are identified. If the decoding operation is able to determine which bit or bits in the symbol is errored, process 46 simply identifies those bits in the symbol. However, when the number of errored bits exceeds the correctable number of bits, the decoding operation itself is typically not able to identify which particular bits of the symbol are errored, or else it could readily correct those bits. Rather, the decoding operation only knows that a data word cannot be resolved from the retrieved symbol. In this situation, additional operations are performed in process 46 to identify the failed cells in array 20 corresponding to the errored bits in the symbol.

According to one embodiment, process 46 is performed by writing and reading both data states to and from all of the cells at the failing memory address. A simple approach for this is to write all of the cells at this address to a "0" data state, and then read those cells to identify any not returning a "0" data state; similarly, all cells at this address are written to a "1" data state and then read back to identify any not returning the "1". Alternatively, other patterns such as alternating "0" and "1" states may be used, so long as each cell is tested for each data state. The ECC encoding applied by ECC encoder/decoder 30 may be temporarily disabled during this process 46, or the data pattern written and read may be adjusted to ensure that not only the main array bits but also the ECC bits are tested at both data states. Those cells corresponding to the failing memory address that fail to return both data states are thus identified.

ECC encoder/decoder 30 issues the appropriate signals resulting from process 46 to redundancy control logic 32, for example with some identification of the identified failed cells for the failing memory address. Redundancy control logic 32 determines, in decision 47, whether redundant memory cells are available for one or more these failed cells. In the architecture of FIG. 1, this determination will of course depend on the number of failed cells identified, and whether the appropriate partitions of redundant columns $25_0$, $25_1$ are already being used for a different memory address. Depending on the strength of the ECC code, it is contemplated that not all failed cells need be replaced in order for the number of errored symbol bits to be correctable by ECC decoding. For example, if the number of errored bits exceeds the correctable number by one, only one cell need be replaced in order for the data word to be correctly recovered. If the availability of redundant memory cells depends on the bit position within array 20, it is contemplated that redundancy control logic 32 may include sufficient logic functionality to select how many and which cells to replace.

If redundant memory cells are available to replace one or more failed cells at the failing memory address (decision 47 is "yes"), redundancy control logic 32 enables those redundant cells accordingly in process 48. This process 48 will typically involve the storing of the failing memory address in non-volatile memory within or accessible to redundancy control logic 32 so that the received logical memory address will be correctly mapped to refer to a redundant cell in one of redundant columns $25_0$, $25_1$ in place of the failed cell, in this embodiment. The appropriate return from the interrupt handler is executed in process 50, for example to restore context and the like (including restoring of the contents of memory 20 at the failing address, if possible), and memory 10 returns to its normal system operation.

On the other hand, if redundancy is not available for the failed cells (decision 47 is "no"), such as occurs when the redundant columns 25 have previously been assigned to other memory addresses, the read of memory array 20 at the failing memory address is considered to have failed. The system in which memory 10 is implemented than issues and processes the appropriate fault for a memory failure.

Various alternatives to this operation of memory 10 according to this embodiment are contemplated. For example, decision 43 may invoke interrupt 44 to enable redundancy on the first errored bit detected in the decoding of the symbol read in process 42, even if that error can be corrected by ECC. Other alternative decision criteria may alternatively be used, for example replacement upon reading a symbol having exactly the correctable number of errored bits, to avoid the event of a failed data read.

These embodiments provide important benefits for solid-state memory devices and embedded memories, particularly for non-volatile memories such as FRAM. The combination of ECC and redundancy in the same memory device according to these embodiments provides extended reliability to the memory during its system life, by enabling replacement of failed memory cells once error correction is no longer adequate to correct for errored bits in the data word. This ability is contemplated to be especially beneficial when applied to non-volatile memories such as FRAM, considering the tendency of ferroelectric material to depolarize over system life. In particular, it is contemplated that the extended reliability provided by these embodiments may enable the higher bit density of 1T-1C FRAM cells despite the inherent lesser read margin as compared with that of 2T-2C cells.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of operating a system comprising a memory array that includes a plurality of memory cells arranged in rows and columns with at least one of the columns being a first redundant column, the method comprising the steps of:
    reading a symbol representing a data word from the memory array at a memory address;
    decoding the symbol to detect whether an error is present in the data word;
    responsive to detecting an error in the data word:
        identifying a failed cell in the memory array at the memory address;
        selecting a partition from a plurality of partitions into which the first redundant column is divided, wherein the selection of the selected partition of the first redundant column is based at least partially on a value indicated by one or more particular bits of the memory address, wherein the rows of the memory array are divided into a plurality of row groups with each of the partitions corresponding to a respective one of the row groups, and wherein the memory address corresponds to a row of the memory array located in a first row group corresponding to the selected partition of the first redundant column; and mapping the memory address to refer to a redundant memory cell located in the selected partition of the first redundant column in place of the failed cell; and then, during the operating of the system, in response to a subsequent read operation at the memory address, accessing the redundant memory cell in place of the failed cell.

2. The method of claim 1, wherein the identifying step comprises:

writing a first data state to each cell in the memory array at the memory address;

then reading each cell at the memory address;

writing a second data state to each cell in the memory array at the memory address; and then reading each cell at the memory address;

wherein the failed cell is identified by one of the reading steps detecting an incorrect data state from one of the cells at the memory address.

3. The method of claim 1, further comprising:

responsive to detecting a number of errors in the symbol not exceeding a correctable number, correcting the errors in the symbol and forwarding the data word represented by the symbol.

4. The method of claim 3, wherein the mapping step is performed responsive to the number of errors in the symbol exceeding the correctable number.

5. The method of claim 3, wherein the mapping step is performed responsive to the number of errors in the symbol being one.

6. The method of claim 1, wherein the symbol comprises a plurality of data bits and one or more error correction code bits.

7. The method of claim 6, wherein, responsive to the failed cell being one of the error correction code bits, the mapping step maps the redundant memory cell to the failed error correction code bit.

8. The method of claim 1, wherein the one or more particular bits of the memory address are a selected number of most significant bits of the memory address.

9. The method of claim 1, further comprising:

reading a second symbol representing a second data word from the memory array at a second memory address, the second memory address corresponding to a row of the memory array located in a second row group different from the first row group;

decoding the second symbol to detect whether an error is present in the second data word;

responsive to detecting an error in the second data word:

identifying a second failed cell in the memory array at the second memory address;

selecting a second partition from the plurality of partitions of the first redundant column based at least partially on a value indicated by one or more particular bits of the second memory address, and wherein the second row group corresponds to the selected second partition of the first redundant column; and mapping the second memory address to refer to a second redundant memory cell located in the selected second partition of the first redundant column in place of the second failed cell, wherein the second failed cell and the first failed cell are located in different columns of the memory array; and then, during the operating of the system, in response to a subsequent read operation at the second memory address, accessing the second redundant memory cell in place of the second failed cell.

10. A memory, comprising:

a memory array having a plurality of memory cells arranged in rows and columns, wherein the columns include at least a first redundant column, the rows are divided into a plurality of row groups, and the first redundant column is divided into a plurality of partitions, each partition corresponding to a respective one of the row groups;

address circuitry to select a plurality of memory cells corresponding to a memory address, the selected memory cells storing a symbol corresponding to a data word coded according to an error detection code;

read/write circuitry to read data from and write data to the selected memory cells;

error detection logic to determine whether an error is present in a symbol read from the selected memory cells by the read/write circuitry;

redundancy logic to:

in response to the error detection logic detecting an error in the symbol read from the selected memory cells, identify a failed cell in the selected memory cells;

select a partition from the partitions of the first redundant column based at least partially on a value indicated by one or more particular bits of the memory address corresponding to the selected memory cells, wherein the selected memory cells are located in a row of the memory array belonging to a row group that corresponds to the selected partition of the first redundant column; and map the memory address to refer to a redundant memory cell located in the selected partition in place of the failed cell.

11. The memory of claim 10, wherein the error detection logic comprises:

error correction logic, for correcting one or more errored bits in the symbol retrieved from the selected memory cells.

12. The memory of claim 11, wherein the error correction logic is capable of correcting up to a correctable number of errored bits in a symbol;

and wherein the redundancy logic maps the memory address to refer to the redundant memory cell responsive to the error detection logic detecting a number of errored bits in the symbol exceeding the correctable number.

13. The memory of claim 11, wherein the redundancy logic is configured to map the memory address to refer to the redundant memory cell responsive to the error detection logic detecting a single errored bit in the symbol.

14. The memory of claim 10, wherein the plurality of memory cells are non-volatile memory cells.

15. The memory of claim 14, wherein the non-volatile memory cells are ferroelectric memory cells.

16. The memory of claim 15, wherein the ferroelectric memory cells are of the one transistor - one capacitor type.

17. The memory of claim 14, wherein the plurality of memory cells are non-volatile memory cells; and the redundancy logic comprises a non-volatile memory including additional non-volatile memory cells to store mapping information, the mapping information including the mapping of the memory address to refer to the redundant memory cell located in the selected partition in place of the failed cell.

18. The memory of claim 17, wherein the non-volatile memory cells of the memory array and the additional non-volatile memory cells of the non-volatile memory of the redundancy logic each comprise at least one ferroelectric capacitor.

19. The memory of claim 18, wherein:
the non-volatile memory cells of the memory array are one transistor—one capacitor (1T-1C) ferroelectric memory cells; and
the additional non-volatile memory cells of the non-volatile memory of the redundancy logic are two transistor—two capacitor (2T-2C) ferroelectric memory cells.

20. A memory, comprising:
a memory array having a plurality of non-volatile memory cells arranged in rows and columns, wherein the rows include at least a first redundant row, the columns are divided into a plurality of column groups, and the first redundant row is divided into a plurality of partitions, each partition corresponding to a respective one of the column groups;
address circuitry to select a plurality of memory cells corresponding to a memory address, the selected memory cells storing a symbol corresponding to a data word coded according to an error detection code;
read/write circuitry to read data from and write data to the selected memory cells;
error detection logic to determine whether an error is present in a symbol read from the selected memory cells by the read/write circuitry;
redundancy logic to:
in response to the error detection logic detecting an error in the symbol read from the selected memory cells, identify a failed cell in the selected memory cells;
select a partition from the partitions of the first redundant row based at least partially on a value indicated by one or more particular bits of the memory address corresponding to the selected memory cells, wherein the selected memory cells are located in a column of the memory array belonging to a column group that corresponds to the selected partition of the first redundant row; and
store, in another non-volatile memory that is separate from the memory array, mapping information indicating that the memory address is to be mapped to refer to a redundant memory cell located in the selected partition in place of the failed cell, wherein the memory array and the other non-volatile memory comprise non-volatile memory cells of the same type.

* * * * *